United States Patent
Nielsen et al.

(10) Patent No.: US 9,628,064 B2
(45) Date of Patent: Apr. 18, 2017

(54) MULTIPHASE PULSE WIDTH MODULATOR FOR CLASS D AUDIO AMPLIFIERS

(71) Applicant: Merus Audio ApS, Herlev (DK)

(72) Inventors: Allan Nogueras Nielsen, Kgs. Lyngby (DK); Mikkel Høyerby, Herlev (DK)

(73) Assignee: Merus Audio ApS, Herlev (DK)

( * ) Notice: Subject to any disclaimer, the term of this patent is extended or adjusted under 35 U.S.C. 154(b) by 0 days.

(21) Appl. No.: 14/917,688

(22) PCT Filed: Sep. 1, 2014

(86) PCT No.: PCT/EP2014/068521
§ 371 (c)(1),
(2) Date: Mar. 9, 2016

(87) PCT Pub. No.: WO2015/036272
PCT Pub. Date: Mar. 19, 2015

(65) Prior Publication Data
US 2016/0218703 A1    Jul. 28, 2016

(30) Foreign Application Priority Data

Sep. 10, 2013   (EP) .................................... 13183749

(51) Int. Cl.
*H03F 99/00*   (2009.01)
*H03K 7/08*   (2006.01)
(Continued)

(52) U.S. Cl.
CPC .............. *H03K 7/08* (2013.01); *H03F 3/183* (2013.01); *H03F 3/2173* (2013.01);
(Continued)

(58) Field of Classification Search
CPC .. H03K 7/08; H03K 4/08; H03F 3/183; H03F 3/007; H03F 3/2173
See application file for complete search history.

(56) References Cited

U.S. PATENT DOCUMENTS

2002/0190789 A1*  12/2002  Morita .................. H03F 3/2173
                                                   330/10
2007/0116109 A1*   5/2007  Stanley ..................... H03F 1/32
                                                   375/238

(Continued)

FOREIGN PATENT DOCUMENTS

EP         1787391 B1    4/2009
WO    WO2012/055968 A1   5/2012

OTHER PUBLICATIONS

International Search Report corresponding to Application No. PCT/EP2014/068521, European Patent Office, dated Sep. 19, 2014; (3 pages).

(Continued)

*Primary Examiner* — Simon Sing
(74) *Attorney, Agent, or Firm* — Nixon Peabody LLP

(57) ABSTRACT

A multiphase pulse width modulator (PWM) producing N mutually phase shifted PWM signals, which is well-suited for class D audio amplifier applications. The multiphase PWM includes (a) N+1 (N ≥2) analog triangular waveform generators producing N+1 mutually phase shifted triangular waveforms, and (b) N+1 comparators each having a first input coupled to each of the N+1 triangular waveforms and a second input coupled to an audio signal to generate N+1 mutually phase shifted PWM phase signals. A crosspoint switch includes N+1 inputs coupled to the N+1 PWM phase signals, and N outputs to supply the N PWM signals. A crosspoint switch controller selectively connects each of the N+1 inputs to each of the N outputs for a duration of a cycle time in a time sequence to simultaneously generate the N PWM signals such that each signal has interleaved time segments of the N+1 PWM phase signals.

20 Claims, 7 Drawing Sheets

(51) Int. Cl.
　　　H03F 3/217　　　(2006.01)
　　　H03F 3/183　　　(2006.01)
　　　H03K 4/08　　　(2006.01)
　　　H04R 3/00　　　(2006.01)
　　　H02M 3/158　　　(2006.01)

(52) U.S. Cl.
　　　CPC ............. *H03F 3/2178* (2013.01); *H03K 4/08* (2013.01); *H04R 3/007* (2013.01); *H02M 2003/1586* (2013.01); *H03F 2200/03* (2013.01); *H03F 2200/129* (2013.01); *H03F 2200/351* (2013.01)

(56) References Cited

U.S. PATENT DOCUMENTS

| | | | |
|---|---|---|---|
| 2008/0084716 A1* | 4/2008 | Ganev | H02M 1/14 363/39 |
| 2009/0066382 A1* | 3/2009 | Yousefzadeh | H02M 3/1584 327/175 |
| 2009/0080225 A1* | 3/2009 | Dijkhuizen | H02M 7/537 363/65 |
| 2010/0278228 A1* | 11/2010 | Vromans | H03F 3/24 375/238 |
| 2013/0082747 A1 | 4/2013 | Kris | |
| 2013/0235923 A1* | 9/2013 | Schuberth | H04L 25/4902 375/238 |

OTHER PUBLICATIONS

International Written Opinion corresponding to Application No. PCT/EP2014/068521, European Patent Office, dated Sep. 19, 2014; (3 pages).

* cited by examiner

MULTIPHASE PULSE WIDTH MODULATOR FOR CLASS D AUDIO AMPLIFIERS

CROSS-REFERENCE TO RELATED APPLICATIONS

This application is a U.S. National Stage of International Application No. PCT/EP2014/068521, filed Sep. 1, 2014, which claims the benefit of European Patent Application No. 13183749.4, filed Sep. 10, 2013, both of which are incorporated herein by reference in their entireties.

The present invention relates to a multiphase pulse width modulator producing N mutually phase shifted pulse width modulated signals having a predetermined cycle time. The multiphase pulse width modulator is particularly well-suited for application in class D audio amplifiers. The multiphase pulse width modulator comprises N+1 analog triangular waveform generators configured to produce respective N+1 mutually phase shifted analog triangular waveforms. The multiphase pulse width modulator further comprises N+1 comparators each comprising a first input operatively coupled to respective ones of the N+1 mutually phase shifted analog triangular waveforms and a second input coupled to an audio signal to generate at least N+1 mutually phase shifted pulse width modulated phase signals. A crosspoint or matrix switch comprises N+1 input terminals, coupled to respective ones of the N+1 mutually phase shifted pulse width modulated phase signals, and N output terminals configured for supplying respective ones of the N mutually phase shifted pulse width modulated signals. A crosspoint switch controller of the cross-point switch is configured to selectively connect each of the N+1 input terminals to each output terminal of the N output terminals for a duration of the predetermined cycle time in a predetermined time sequence to simultaneously generate the N mutually phase shifted pulse width modulated signals such that each of the signals comprises interleaved time segments of the N+1 mutually phase shifted pulse width modulated phase signals; N being a positive integer larger than or equal to 2.

BACKGROUND OF THE INVENTION

A class D audio amplifier is a well-known type of audio power amplifier which is generally recognized to provide energy efficient audio drive of loudspeakers by switching a pulse width modulated (PWM) or pulse density modulated (PDM) signal across the loudspeaker load. Class D audio amplifiers typically comprise an H-bridge based output stage coupled to the loudspeaker load to apply an oppositely phased pulse width modulated audio signals across the loudspeaker. An inductor-capacitor (LC) lowpass filter is normally inserted between the H-bridge based output stage and the loudspeaker load to suppress carrier wave components in the PWM or PDM output signal. Several modulation schemes for pulse width modulated audio signals have been utilized in prior art PWM based class D amplifiers. In so-called AD modulation, the pulse width modulated audio signal at each output terminal or node of the H-bridge is switched, or toggles, between two different levels in opposite phase. The two different levels typically correspond to the upper and lower power supply rails, respectively, such as the positive and negative DC supply rails of the class D amplifier. In so-called BD modulation, the pulse width modulated signal across the loudspeaker load is alternatingly switched between three levels of which two levels correspond to the above-mentioned upper and lower DC power supply rails and the third level is a zero level that is obtained by simultaneously pulling both sides of the loudspeaker load to one of the DC power supply rails. Both of these modulation schemes generate rather large ripple current in the output inductor of the LC lowpass filter when the class D amplifier is idling which cause significant power losses. This disadvantage has typically been tolerated and controlled to a certain extent by use of relatively large inductors of the LC lowpass filter. However, such large inductors lead to significant increase of costs and size of the class D amplification solution or assembly.

So-called multilevel PWM modulation is a particular advantageous form of pulse width modulation of audio and other signals and possesses numerous benefits over traditional AD and BD modulation as described in detail in the applicant's PCT application No. WO 2012/055968. This kind of multilevel PWM modulation typically involves one or several so-called flying capacitors coupled to the output stage to store a self or internally generated half supply voltage level on an external capacitor. This half supply voltage level is the source of the third voltage level of the PWM output signal. Balancing of the one or more flying capacitors is linked to the accuracy of the multiphase PWM signals. Therefore, multilevel PWM modulation requires accurate multiphase PWM signals to achieve optimum performance. These multiphase PWM signals are preferably generated by a multiphase pulse width modulator which derives the multiphase PWM signals from respective high precision multiphase analog triangle waveforms. The high precision multiphase analog triangle waveforms are used to define the sampling, via respective comparator circuits, of an output signal of an analog loop filter of the multilevel Class D amplifier.

However, generating such accurate multiphase PWM signals presents a significant challenge for various reasons, in particular generating sufficiently well-matched signal phases of multiphase analog triangular waveforms produced by a number of separate analog triangular waveform generators. While it is possible to digitally control a phase shift and frequency or time period of each of these analog triangular waveforms by the application of clock frequency locked digital control signals, maintaining accurate control of the amplitude and offset voltage of the multiphase triangular waveforms produced by such separate triangular waveform generators presents a challenge. The latter signal characteristics are typically determined by active and passive analog components and elements of the triangular waveform generator such as current generators, capacitors, resistors and switches. The values of the latter components inherently possess a certain amount of variation due to production spread or tolerances. While certain well-known integrated circuit design and layout techniques can be utilized to reduce these component variations between the separate analog triangular waveform generators these techniques are insufficient or impractical to make such separately generated multiphase triangular waveforms sufficiently accurate to reach optimal performance in multilevel Class D amplifiers.

This lacking accuracy or matching of the multiphase PWM signals degrades various important performance metrics of multilevel Class D amplifiers such as power efficiency, flying capacitor stability and general audio performance. Accordingly, there is a need in the art for a multiphase pulse width modulator producing multiphase pulse width modulated signals with improved accuracy and matching.

SUMMARY OF INVENTION

A first aspect of the invention relates to a multiphase pulse width modulator producing N mutually phase shifted pulse width modulated signals having a predetermined cycle time. The multiphase pulse width modulator is particularly well-suited for application in class D audio amplifiers, but may be useful in numerous other applications such as power inverters benefitting from accurate and well-matched phase shifted pulse width modulated signals. The multiphase pulse width modulator comprises N+1 analog triangular waveform generators configured to produce respective N+1 mutually phase shifted analog triangular waveforms each comprising a rising segment with substantially linearly increasing signal amplitude, a falling segment with substantially linearly decreasing signal amplitude and an idle signal segment with substantially constant signal amplitude such that a duration of the rising segment and falling segments corresponds to the predetermined cycle time and a duration of the idle segment corresponds to a phase shift between two adjacent phases of the N mutually phase shifted pulse width modulated signals. The multiphase pulse width modulator further comprises N+1 comparators each comprising a first input operatively coupled to respective ones of the N+1 mutually phase shifted analog triangular waveforms and a second input coupled to an audio signal to generate at least N+1 mutually phase shifted pulse width modulated phase signals. A crosspoint or matrix switch comprises N+1 input terminals, coupled to respective ones of the N+1 mutually phase shifted pulse width modulated phase signals, and N output terminals configured for supplying respective ones of the N mutually phase shifted pulse width modulated signals. A crosspoint switch controller of the cross-point switch is configured to selectively connect each of the N+1 input terminals to each output terminal of the N output terminals for a duration of the predetermined cycle time in a predetermined time sequence to simultaneously generate the N mutually phase shifted pulse width modulated signals such that each of the signals comprises interleaved time segments of the N+1 mutually phase shifted pulse width modulated phase signals;

N being a positive integer larger than or equal to 2.

The present multiphase pulse width modulator is capable of generating N highly accurate or well-matched mutually phase shifted pulse width modulated signals which is particularly advantageous for use in multilevel output stages of multi-level class D amplifiers as discussed above. The operation of the crosspoint or matrix switch inserts the interleaved time segments of the N+1 mutually phase shifted pulse width modulated phase signals of the predetermined time sequence into each of the N mutually phase shifted pulse width modulated signals. Hence, signal errors caused by the previously discussed matching problems between the N+1 individual pulse width modulated phase signals, for example caused by variations or mismatch between the N+1 triangular waveform generators and mismatch between the N+1 comparators, are evenly spread out between the 3 (or generally N) pulse width modulated signals. This is achieved because each of the generated pulse width modulated signals includes the same number of interleaved time segments of each of the pulse width modulated phase signals such that mismatch errors in any specific pulse width modulated phase signal are evenly spread out over all of the pulse width modulated signals rather than being confined to e.g. a single pulse width modulated signal derived from a single element of mismatched triangular waveform generator/comparator.

The crosspoint switch preferably comprises a switching network comprising a plurality of semiconductor switches configured for electrically connecting the N+1 input terminals to respective ones of the N output terminals in accordance with the digital control signals of the crosspoint switch controller. The N+1 input terminals are connected to each of the N output terminals in a selective manner according to the predetermined time sequence under control of the digital control signals. The skilled person will appreciate that the switching network of the crosspoint switch may comprise different types of electronic or electromechanical switches such as semiconductor switches, e.g. MOSFETs. MOSFET switches are readily available in standard CMOS semiconductor processes for digital integrated circuits and possess numerous beneficial characteristics such as compact layout, low on-resistance, short switching time etc. The crosspoint switch may comprise N+1 multiplexers coupled in parallel at the input side thereof. The crosspoint switch may comprise N multiplexers which each has N+1 multiplexer inputs and a multiplexer output. The N+1 multiplexer inputs of each multiplexer are preferably coupled to respective ones of the N+1 input terminals of the crosspoint switch and each multiplexer output is coupled one of the N output terminals of the crosspoint switch. Each of the N multiplexers may be controlled by a set of select signals that select which one of the N+1 multiplexer inputs that is routed to the multiplexer output.

The crosspoint switch controller of the cross-point switch may comprise a digital state machine for example integrated on an ASIC or an appropriately configured Field Programmable Logic Array (FPGA) together with the residual components of the present multiphase pulse width modulator. Various circuitry of the associated class D audio amplifier may also be integrated on the ASIC or FPGA. Other embodiments of the crosspoint switch controller may comprise a Digital Signal Processor (DSP) for example comprising a software programmable DSP core or a hardwired customized DSP.

The skilled person will appreciate that the term "N+1" as used herein for example in connection with the N+1 mutually phase shifted analog triangular waveforms means "at least N+1" since one or several additional or redundant triangular waveforms may be generated by corresponding analog triangular waveform generators. The value of N is preferably selected such that it matches the required number of individual phases of the associated multilevel output stage. Hence, N may have a value between 2 and 5 for a large number of practical multilevel output stages.

The crosspoint switch controller is preferably configured to at each point in time connecting a subset of N inputs of the at least N+1 available inputs to respective ones of the N output terminals and disconnecting the residual input(s) of the crosspoint switch from anyone of the N output terminals. The switching between consecutive subsets of N inputs is preferably performed at time intervals corresponding to the predetermined phase shift between two adjacent phases of the N mutually phase shifted pulse width modulated signals.

Hence, the signal switching methodology of the crosspoint switch renders at least a single phase signal of the N+1 mutually phase shifted pulse width modulated phase signals inactive at each time instant. The selection of the inactive pulse width modulated phase signal changes over time and may at this point in time be the idling phase signal, i.e. the phase signal derived from the idle signal segment of the corresponding analog triangular waveform. The pulse width modulated phase signal derived from this idling triangular waveform is not appropriately modulated because of the substantially constant level of the underlying triangular waveform.

The N+1 analog triangular waveform generators are preferably configured to produce a phase shift between the N+1 mutually phase shifted analog triangular waveforms that correspond to the duration of the idle segment. Since the duration of the idle segment corresponds to the phase shift between two adjacent phases of the N mutually phase shifted pulse width modulated signals, i.e. 360 degrees divided by N, this feature arranges the timing between the N+1 mutually phase shifted analog triangular waveforms in a manner where there always exists a subset of N non-idling mutually phase shifted analog triangular waveforms. The phase signals derived from this subset of N non-idling mutually phase shifted analog triangular waveforms are connected to the N output terminals of the crosspoint switch. This timing aspect is explained in detail below in connection with the appended drawings.

In preferred embodiment of the multiphase pulse width modulator, each of N+1 analog triangular waveform generators comprises:

a set of active and passive electrical components defining characteristics of the rising and falling segments of the analog triangular waveform, timing signal inputs for controlling on-sets and durations of the rising and falling segments of the analog triangular waveform and the on-set and duration of the idle segment, an analog DC reference voltage, a reset switch configured to selectively connect and the disconnect the analog triangular waveform to the analog DC reference voltage for the duration of the idle segment to generate the idle segment of the analog triangular waveform.

The set of active and passive electric components may for example comprise a first current source and a second current source configured to selectively charge and discharge a capacitor in accordance with the timing signal inputs to determine the rising and falling segments of the analog triangular waveform. The currents supplied by the first and second current sources are preferably substantially identical and the rising and falling segments of the same duration to provide a symmetrical triangular waveform portion of each of the analog triangular waveforms. The analog DC reference voltage may be derived from a band-gap reference circuit producing a stable and accurate DC voltage level.

The predetermined cycle time of each of the N mutually phase shifted pulse width modulated signals will vary depending on the desired or target application of the class D amplifier, but may correspond to a PWM carrier frequency between 150 kHz and 5 MHz corresponding to a cycle time between 6.67 µs and 0.2 µs of the N mutually phase shifted pulse width modulated signals.

A second aspect of the invention relates to a class D audio amplifier comprising a multiphase pulse width modulator according to any of the preceding claims. In the class D audio amplifier, the N mutually phase shifted pulse width modulated signals are coupled to respective output power transistors of a multi-level output stage of the class D audio amplifier. The second input of each of the N+1 comparators may furthermore be coupled to the audio signal output of a loop filter of a feedback loop of the class D audio amplifier. Hence, the N+1 mutually phase shifted pulse width modulated phase signals are modulated by the audio signal output of the loop filter.

A third aspect of the invention relates to a sound reproducing assembly comprising: the class D audio amplifier according to any of the above described embodiments thereof and a loudspeaker load operatively coupled to an output of the output stage.

A fourth aspect of the invention relates to a method of generating N mutually phase shifted pulse width modulated signals for class D audio amplifiers. Each of the N mutually phase shifted pulse width modulated signals having a predetermined cycle time. The method comprising steps of:

generating N+1 mutually phase shifted analog triangular waveforms each comprising a rising segment with substantially linearly increasing signal amplitude, a falling segment with substantially linearly decreasing signal amplitude and an idle signal segment with substantially constant signal amplitude such that a duration of the rising and falling segments corresponds to the predetermined cycle time and a duration of the idle segment corresponds to a phase shift between two adjacent phases of the N mutually phase shifted pulse width modulated signals, comparing each of the N+1 mutually phase shifted analog triangular waveforms to an audio signal to generate N+1 mutually phase shifted pulse width modulated phase signals;

applying the N+1 mutually phase shifted pulse width modulated phase signals to a respective ones of N+1 input terminals of a crosspoint or matrix switch, selectively connecting, in a predetermined repetitive sequence, each of the N+1 input terminals to each output terminal of N output terminals of the crosspoint or matrix switch for a duration of the predetermined cycle time to simultaneously generate the N mutually phase shifted pulse width modulated signals such that each signal comprises interleaved time segments of the N+1 pulse width modulated phase signals;

N being a positive integer larger than or equal to 2.

BRIEF DESCRIPTION OF THE DRAWINGS

Preferred embodiments of the invention will be described in more detail in connection with the appended drawings, in which.

DETAILED DESCRIPTION OF PREFERRED EMBODIMENTS

Figure 1:
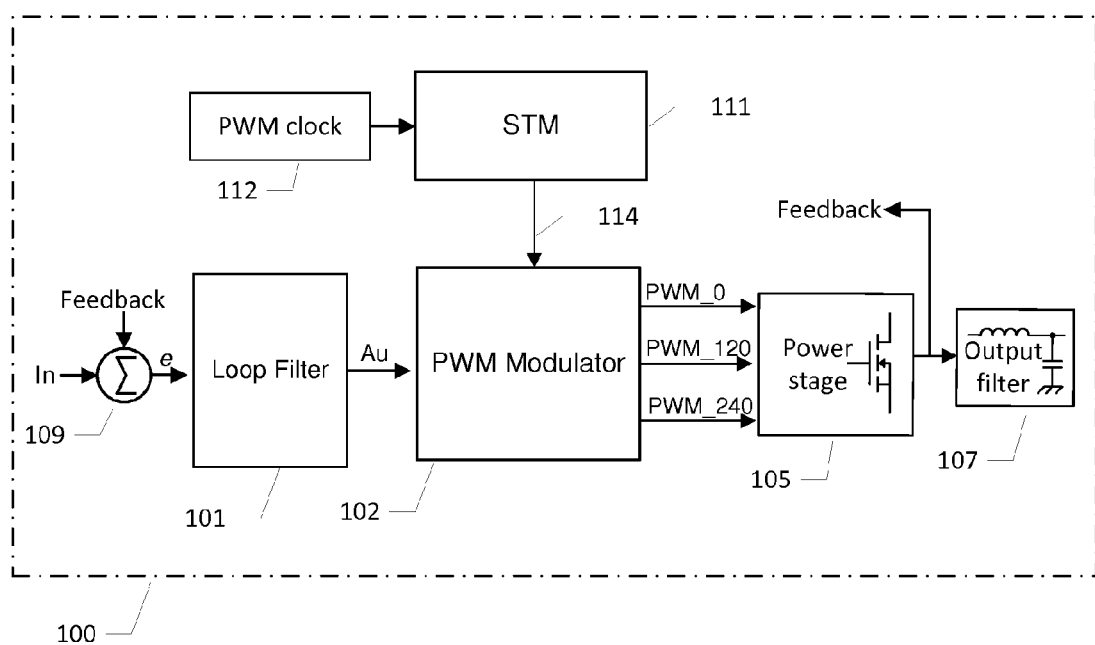
FIG. 1 is a simplified block diagram of a class D audio amplifier comprising a multiphase pulse width modulator in accordance with a first preferred embodiment of the invention.

FIG. 1 is a schematic illustration of a PWM based class D audio amplifier 100 comprising a multiphase pulse width modulator 102 producing 3 mutually phase shifted pulse width modulated signals, PWM_0, PWM_120 and PWM_240, to an output power stage 105 which may comprise differential or H-bridge output driver. The output power stage is a multi-level PWM stage comprising 3 distinct output voltage levels exhibiting the previously discussed advantages of traditional class AD and BD modulation. The skilled person will appreciate that the other embodiments of the multiphase pulse width modulator 102 may be configured to generate fewer or more mutually phase shifted pulse width modulated signals, for example 2, 4 or 5 pulse width modulated signals, for a correspondingly adapted multi-level output stage as discussed in detail below. The output power stage 105 may comprise a gate drive circuit that increases signal amplitudes of the 3 mutually phase shifted pulse width modulated signals, PWM_0, PWM_120 and PWM_240, for eight semiconductor switches of the H-bride based power stage. Hence, allowing the individual semiconductor switches such as MOSFETs or IGBTs, to be appropriately placed in ON and OFF states. The PWM modulated output signal of the output power stage 105 is applied to a loudspeaker through an output filter circuit 107 providing lowpass filtering of the PWM modulated output signal to attenuate PWM carrier frequency components thereof and hence shield the loudspeaker from potentially harmful high-frequency signals. The output filter circuit 107 may comprises a load inductor and a load capacitor coupled to each of first and second complementary output nodes of the H-bridge based power stage or output driver 105. The PWM carrier frequency or modulation frequency may lie between 300 kHz and 5 MHz in a number of useful embodiments.

A crosspoint switch controller comprises a state machine 111 (STM) that controls internal operations of the multiphase pulse width modulator 102 through a set of digital control signals, schematically illustrated as data bus 114. The state machine 111 functions as a crosspoint switch controller and may comprise an appropriately configured collection of combinatorial and sequential digital logic. The crosspoint switch controller 111 may in the alternative form part of a microprocessor or Digital Signal Processor (DSP) either in software programmable configuration or as dedicated hardware configured to provide the below described functions or operations in accordance with a set of executable program instructions or hardwired states. The skilled person will understand that the microprocessor or Digital Signal Processor may be used to implement other control and signal processing functions of the PWM based class D audio amplifier 100 than those related to the crosspoint switch controller 111 such that the latter is integrated with a more general controller of the entire class D audio amplifier 100. The state machine 111 is supplied by a PWM clock signal through PWM clock generator 112 to control the timing of operations inside the state machine 111. The PWM clock signal is also supplied to the H-bridge based power stage 105 ensuring that the state machine 111 and H-bridge circuitry are operating synchronously.

The class D audio amplifier 100 further comprises an analog feedback loop arranged around the H-bridge based power stage 105 and enclosing the multiphase pulse width modulator 102 and an adjustable or fixed loop filter 101. The analog feedback loop comprises an analog summing node 109 arranged in front of the loop filter 101 for receipt of analog audio input signals at the Audio In node. A feedback signal derived from the H-bridge based power stage 105, i.e. prior to the output filter circuit 107, is coupled to the summing node 109, for example via a feedback attenuator (not shown). The feedback signal is subtracted from the analog audio input signal by the summing node 109 forming an error signal or difference signal, e, which is applied to an input of the loop filter 101. The output of the loop filter is an filtered audio signal, Au, which is applied to the input of the multiphase pulse width modulator 102. This filtered audio signal is applied in parallel to a number of comparator circuits inside the multiphase pulse width modulator 102 for generation of corresponding pulse width modulated phase signals as explained in additional detail below with reference to the detailed schematic of the multiphase pulse width modulator 102.

Figure 2:
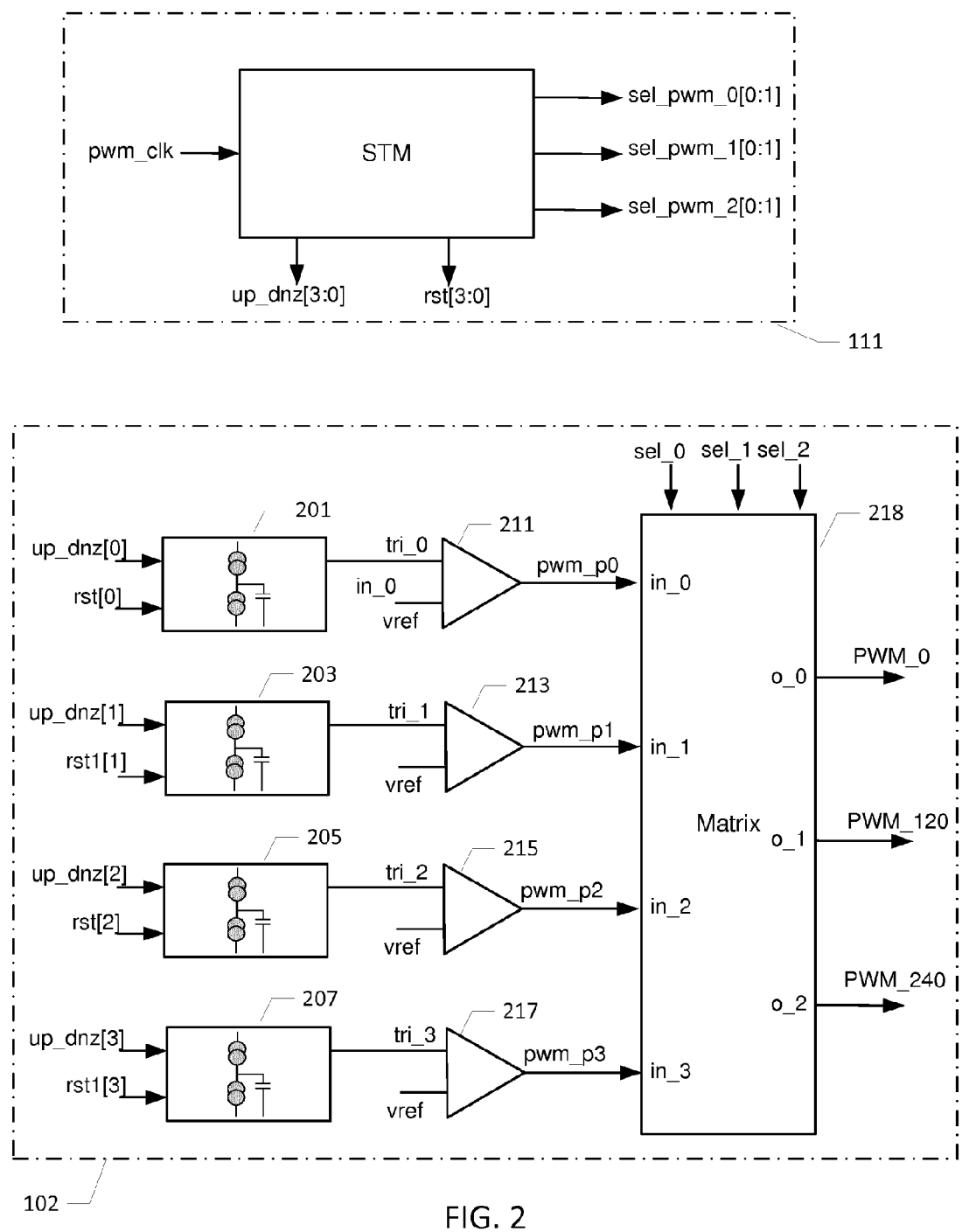
FIG. 2 is a schematic diagram of the 3-phase version of the multiphase pulse width modulator in accordance with a first preferred embodiment thereof.

FIG. 2 is a simplified schematic diagram of a preferred embodiment of the multiphase pulse width modulator 102. The multiphase pulse width modulator 102 is controlled by the state machine 111 via a number of digital control signals up_dnz[3:0], rst[3:0], sel_pwm_0[0:1], sel_pwm_1[0:1] and sel_pwm_2[0:1]. This collection of digital controls signals were schematically illustrated a control bus 114 on FIG. 1.

The multiphase pulse width modulator 102 is configured for producing the 3 previously discussed mutually phase shifted pulse width modulated signals, PWM_0, PWM_120 and PWM_240. Each of these mutually phase shifted pulse width modulated signals has a predetermined cycle time set by the selected carrier frequency of the pulse width modulated signals. This carrier frequency may be set to the frequency of the PWM clock signal discussed above. The selection of carrier frequency will vary depending on the desired or targeted application of the class D amplifier, but may lie between 300 kHz and 5 MHz. Hence, the predetermined cycle time may lie between The multiphase pulse width modulator 102 comprises 4 analog triangular waveform generators 201, 203, 205 and 207. Each of the analog triangular waveform generators is configured to produce an analog triangular waveform at the generator output. This analog triangular waveform is applied to a first input, trio_0 for the first comparator 221, of an associated comparator circuit. Each of the analog triangular waveform generators 201, 203, 205 and 207 preferably comprises a first and a second constant current source coupled to a common node of a charge holding capacitor. By alternatingly charging and discharging the charge holding capacitor with the first and second constant current sources, respectively, a rising segment with substantially linearly increasing signal amplitude and a falling segment with substantially linearly decreasing signal amplitude is generated at the common node. The on-set and duration of the rising segment and the falling segment of the analog triangular waveform is controlled by a first up/down control signal up_dnz[0], which is one control line of the previously discussed control signal up_dnz[3:0], applied to the first analog triangular waveform generator 201. The first analog triangular waveform additionally comprises an idle signal segment with substantially constant signal amplitude. This substantially constant signal amplitude is preferably generated by clamping the common output node at the holding capacitor to a well-defined DC reference voltage by a semiconductor switch for appropriately small on-resistance. This voltage clamping action is controlled by the control signal rst[0] which is applied to a control terminal of the semiconductor switch, e.g. a gate terminal of a MOSFET. This clamping of the first analog triangular waveform at the DC reference voltage fixes the bottom level of the first analog triangular waveform. Furthermore, the duration of the idle signal segment corresponds to the phase shift between two adjacent phases of the N mutually phase shifted pulse width modulated signals PWM_0, PWM_120 and PWM_240, i.e. 120 degrees in the present embodiment, which is a sufficiently long time to allow a very accurate setting of the bottom level of the first analog triangular waveform with the derived advantages discussed below. A duration of the rising segment and falling segment corresponds substantially to the predetermined cycle time which in turn corresponds to one cycle or period time of the PWM carrier frequency. The timing aspects of the rising, falling and idling segments of each of the analog triangular waveforms relative to the cycle time of the PWM signals are discussed below with reference to the waveforms graphs on FIG. 3. The generator output of each of the analog triangular waveform generators may be taken from the common node at the charge holding capacitor. This voltage may be directly transmitted to the generator output or for example via a suitable buffer device or circuit.

The multiphase pulse width modulator 102 further comprises 4 comparators, for example continuous time or switched comparator circuits, 211, 213, 215 and 217. Each of the 4 comparators has a first input, tri_1 to tri_4, coupled to a respective one of the generator outputs of the 4 analog triangular waveform generators 201, 203, 205 and 207. A second input, vref, of each of the 4 comparators are all connected to the same previously discussed filtered audio signal, Au, outputted by the loop filter 101 of FIG. 1. Hence, each of the comparator circuits, 211, 213, 215 and 217 generates a pulse width modulated phase signal at the output, i.e. pwm_p0, pwm_p1, pwm_p2 and pwm_p3 encoding the same filtered audio signal albeit with mutual phase differences defined by corresponding phase differences between the analog triangular waveforms generated by the 4 analog triangular waveform generators 201, 203, 205 and 207.

The state machine 111 controls the relative phase shift between the analog triangular waveforms tri_0, tri_1,tri_2 and tri_3 by controlling the timing of each of the analog triangular waveform generators 201, 203, 205 and 207. The first analog triangular waveform generator 201 is controlled by the first up/down control signal, or control bit up_dnz[0] such that the rising segment is activated by one logic level of the control bit and the falling segment by the opposite logic level. Finally, when the control signal, or control bit, rst[0] goes logic high, the analog triangular waveform tri_0, is clamped to the DC reference voltage to initialize the idle segment of the analog triangular waveforms tri_0 which lasts for the duration that corresponds to the previously discussed phase shift between two adjacent phases of the 3 mutually phase shifted pulse width modulated signals such as the phase shift between PWM_120 and PWM_240. The duration of the selected logic level of the first up/down control signal up_dnz[0] sets the duration of the rising segment of the first analog triangular waveforms tri_0 and the duration of the selected opposite logic level of the first up/down control signal up_dnz[0] likewise sets the duration of the falling segment. The state machine 111 is configured such that the combined duration of the rising and falling segments equals the predetermined cycle, i.e. the cycle time of the each of the phase shifted pulse width modulated signals PWM_0, PWM_120 and PWM_240. The residual analog triangular waveform generators 203, 205 and 207 and their associated comparator circuits, 213, 215 and 217 function in a similar manner under timing control of the respective sets of control signals or bits up_dnz[1], rst[1]; up_dnz[2], rst[2] and up_dnz[3], rst[3]. However, the control signals are mutually shifted in phase by the above discussed phase shift between two adjacent phases of the phase shifted pulse width modulated signals PWM_0, PWM_120 and PWM_240 as explained below with reference to FIG. 3. The outcome of the four analog triangular waveform generators 201, 203, 205 and 207 is four mutually phase shifted analog triangular waveforms tri_0, tri_1,tri_2 and tri_3 as discussed in detail below.

The pulse width modulated phase signals pwm_p0, pwm_p1, pwm_p2 and pwm_p3, are applied to respective inputs terminals, in_0-in_3, of a crosspoint or matrix switch 218. The crosspoint switch 218 is configured to via an internal switching network coupling the four input terminals in_0-in_3 to respective ones of the 3 output terminals o_0, o_1 and o_2 as described below. Hence, at each time point, 3 of the four input terminals in_0-in_3 is electrically coupled to respective ones of the 3 output terminals o_0, o_1 and o_2 in accordance with the input-to-output routing selection defined by the digital select signals or bits sel_0, sel_1 and sel_2. A particular routing selection last for the duration of the first time period where after an new routing selection is made by the state machine by an appropriate new setting of the digital select signals. The latter digital select signals are generated by the state machine 111. Accordingly, at each time point a single one of the four input terminals in_0-in_3 remains uncoupled to anyone of the 3 output terminals o_0, o_1 and o_2. The uncoupled or unselected input terminal is the one where the applied pulse width modulated phase signal is generated from a triangular waveform in the idle segment as explained in further detail below. At each of the output terminals o_0, o_1 and o_2, each of the mutually phase shifted pulse width modulated signals, PWM_0, PWM_120 and PWM_240 is generated by stitching or splicing time segments of the pulse width modulated phase signals pwm_p0, pwm_p1, pwm_p2 and pwm_p3 in accordance with a predetermined time sequence. Hence, the mutually phase shifted pulse width modulated signals, PWM_0, PWM_120 and PWM_240 are generated simultaneously by interleaving the four pulse width modulated phase signals pwm_p0, pwm_p1, pwm_p2 and pwm_p3 at each of the output terminals o_0, o_1 and o_2, but at each time point using different pulse width modulated phase signals.

The skilled person will appreciate that the internal switching network of the crosspoint switch 218 may comprise different types of switches such as semiconductor switches, e.g. MOSFETs. MOSFET switches are readily available in standard CMOS semiconductor processes for digital integrated circuits and have numerous beneficial characteristics such as compact layout low on-resistance short switching time etc. The crosspoint switch 218 may comprise three separate 4-input/one-output digital multiplexers where each multiplexer is controlled by two control bits. The four inputs of the 4-input digital multiplexers are coupled in parallel to respective ones of the pulse width modulated phase signals pwm_p0, pwm_p1, pwm_p2 and pwm_p3 while the output terminals o_0, o_1 and o_2, are the respective outputs of the multiplexes.

Figure 3:
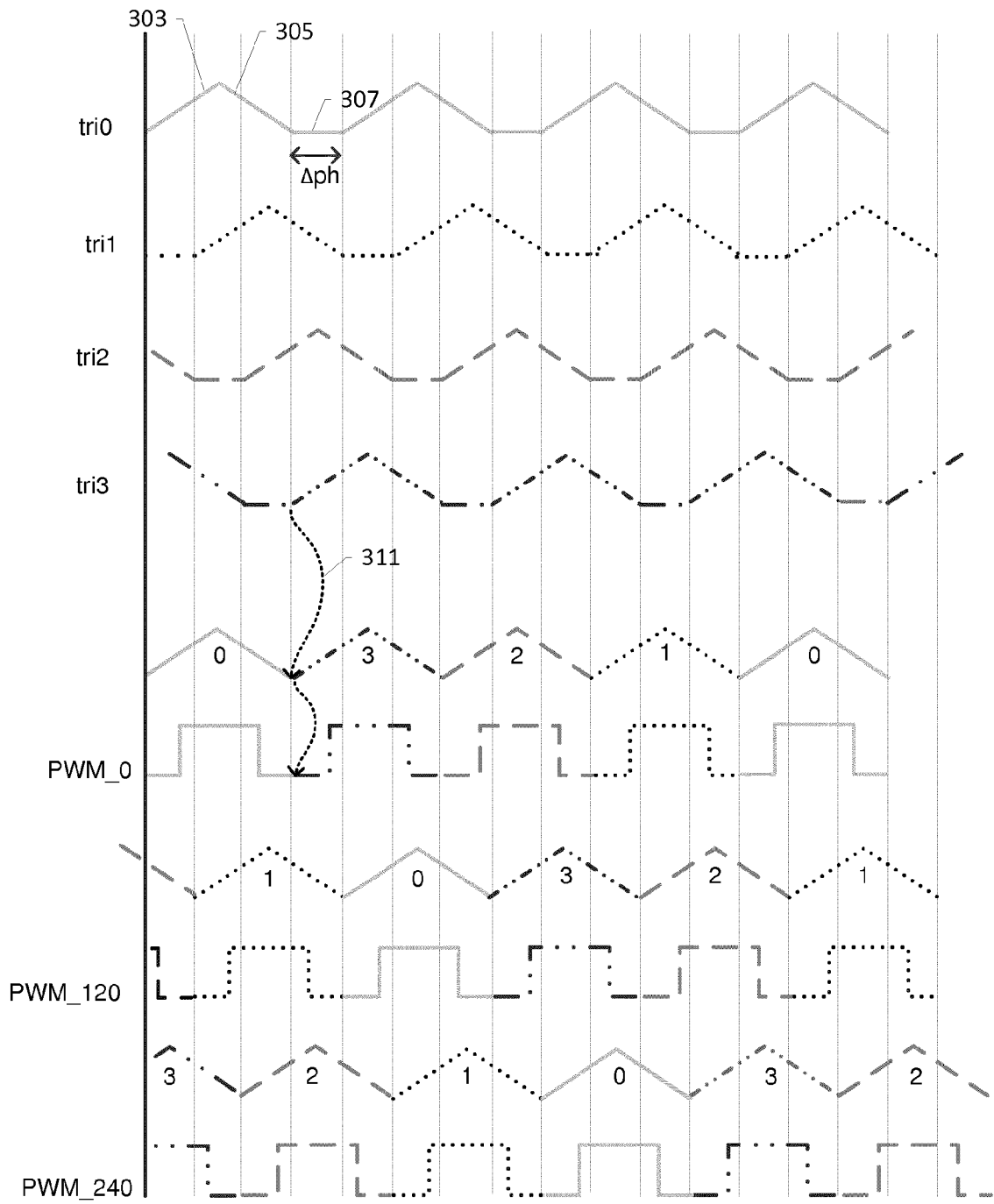
FIG. 3 is a plot of 4 exemplary multiphase analog triangular waveforms and 3 corresponding pulse width modulated signals generated by the 3-phase version of multiphase pulse width modulator on FIG. 2.

The above outlined methodology of generating each of the mutually phase shifted pulse width modulated signals, PWM_0, PWM_120 and PWM_240 by splicing interleaved time segments of the pulse width modulated phase signals pwm_p0, pwm_p1, pwm_p2 and pwm_p3 is schematically illustrated on FIG. 3. The 4 uppermost waveforms are the first to fourth mutually phase shifted analog triangular waveforms tri_0, tri_1,tri_2 and tri_3, respectively, discussed in connection with FIG. 2 above. Each of the analog triangular waveforms comprises as illustrated on the tri_0 waveform, a rising segment 303 with substantially linearly increasing signal amplitude and a falling segment 305 with substantially linearly decreasing signal amplitude and an idle signal segment 307 with substantially constant signal amplitude. The duration of idle signal segment 307 is marked by symbol Δph and corresponds to the phase shift of 120 degrees between the adjacent phases of the mutually phase shifted pulse width modulated signals PWM_0, PWM_120 and PWM_240 as discussed above. The duration of each of the idle signal segments of the residual triangular waveforms is the same. The phase shift between two of the analog triangular waveforms tri_0, tri_1,tri_2 and tri_3 also corresponds to duration of idle signal segment 307. In effect, when one of the four mutually phase shifted analog triangular waveforms tri_0, tri_1,tri_2 and tri_3 is idling, there are always three other analog triangular waveforms which are non-idling and therefore supplying respective valid the pulse width modulated phase signals.

Hence, the duration of the idle signal segments result in each of the four analog triangular waveforms tri_0, tri_1, tri_2 and tri_3 has a cycle time or period corresponding to four times the phase shift Δph and this applies to the cycle time of each of the pulse width modulated phase signals pwm_p0, pwm_p1, pwm_p2 and pwm_p3 as well. On the other hand, each of the pulse width modulated signals PWM_0, PWM_120 and PWM_240 has a cycle time or period corresponding to three times the phase shift Δph. The depicted pulse width modulated signal PWM_0 is generated by interleaving the four pulse width modulated phase signals pwm_p0, pwm_p1, pwm_p2 and pwm_p3 in the sequence indicated on the depicted triangular waveform above the PWM_0 waveform, i.e. 0, 3, 2, 1, 0 etc. indicating the waveform segment sequence of: pwm_p0, pwm_p3, pwm_p2, pwm_p1, pwm_p0 etc. The line type of each time segment of the depicted pulse width modulated signal PWM_0 indicates the origin of the time segment in terms of corresponding analog triangular waveform and corresponding pulse width modulated phase signal. The same naturally applies for the two residually depicted pulse width modulated signals PWM_120 and PWM_240. The pulse width modulated signals PWM_120 and PWM_240 are generated by the same time sequence of the four pulse width modulated phase signals pwm_p0, pwm_p1, pwm_p2 and pwm_p3 as the PWM_0 albeit delayed by four times Δph which it turns corresponds to one cycle of the analog triangular waveforms. The relative or mutual phase shift between the adjacent pulse width modulated signals PWM_0 and PWM_120 amounts to 120 degrees or one time Δph, which as previously explained represents one third cycle time of the pulse width modulated signals.

Each of the time segments of the depicted pulse width modulated signal PWM_0 has a duration of the first time period and the switching between two of the four pulse width modulated phase signals is always performed when the waveform is zero. Furthermore, the time sequence of the four pulse width modulated phase signals pwm_p0, pwm_p1, pwm_p2 and pwm_p3 is selected by the state machine 111 such that for each of the pulse width modulated signals, the switching from one phase signal to the subsequent phase signal is carried out exactly when the corresponding triangular analog waveform reaches the end of its idle segment. This feature or property is illustrated by dotted arrow 311 for the switching from phase signal tri_0 to phase signal tri_3 in the depicted pulse width modulated signal PWM_0. This property is advantageous because it ensures that the level of the idle segment in question has settled to the previously discussed analog DC reference voltage with great accuracy which means that a bottom level, or start level, of the analog triangular waveform is tightly controlled. This minimizes bottom level spread between the four analog triangular waveforms tri_0, tri_1,tri_2 and tri_3 and therefore improves matching between the pulse width modulated phase signals pwm_p0, pwm_p1, pwm_p2 and pwm_p3.

The presence of a redundant phase signal pulse width modulated phase signals accordingly allows improvement of the accuracy and matching of the four analog triangular waveforms tri_0, tri_1,tri_2 and tri_3.

The combined functionally of the cross-point controller 111 and crosspoint switch 218 with regards to the selection and stitching of the pulse width modulated phase signals pwm_p0, pwm_p1, pwm_p2 and pwm_p3 is that each of the four (in general N+1) input terminals of the crosspoint switch is selectively coupled to each of the 3 output terminals (N terminals in general) over time in accordance with the time sequence. At each point in time, one of the pulse width modulated phase signals is rendered unused, i.e. not connected to anyone of the 3 output terminals of the crosspoint switch 218. In this manner, each of the three pulse width modulated signals PWM_0, PWM_120 and PWM_240 are generated by interleaving and splicing together time segments of the each of the four pulse width modulated phase signals in the predetermined time sequence, albeit phase shifted relative to each other such that 3 (or generally N) different pulse width modulated phase signals of the generated 4 (or generally N+1) different phase signals are connected to the 3 (or generally N) output terminals at any point in time. The predetermined time sequence of the time segments of each of the pulse width modulated phase signals is depicted on the analog triangular waveforms above each of the signals PWM_0, PWM_120 and PWM_240. In this embodiment, the time sequence is 0-3-2-1-0-3-2 etc. The time sequence is the same for all of the signals PWM_0, PWM_120 and PWM_240 but with 480 degrees of phase shift (corresponding to the period time of the analog triangular waveforms tri0-tri3) between each pair of adjacent signals of the mutually phase shifted pulse width modulated signals.

Hence, signal errors caused by the previously discussed matching problems between the N+1 individual pulse width modulated phase signals, caused by variations or mismatch between the N+1 triangular waveform generators and mismatch between the N+1 comparators, are evenly spread out between the 3 (or generally N) pulse width modulated signals. This is achieved because each of the generated pulse width modulated signals includes the same number of interleaved time segments of each of the 4 (N+1) pulse width modulated phase signals such that mismatch errors in any specific pulse width modulated phase signal are evenly spread out over all the pulse width modulated signals rather than being confined to e.g. a single pulse width modulated signal derived from a mismatched triangular waveform generator/comparator.

Figure 4:
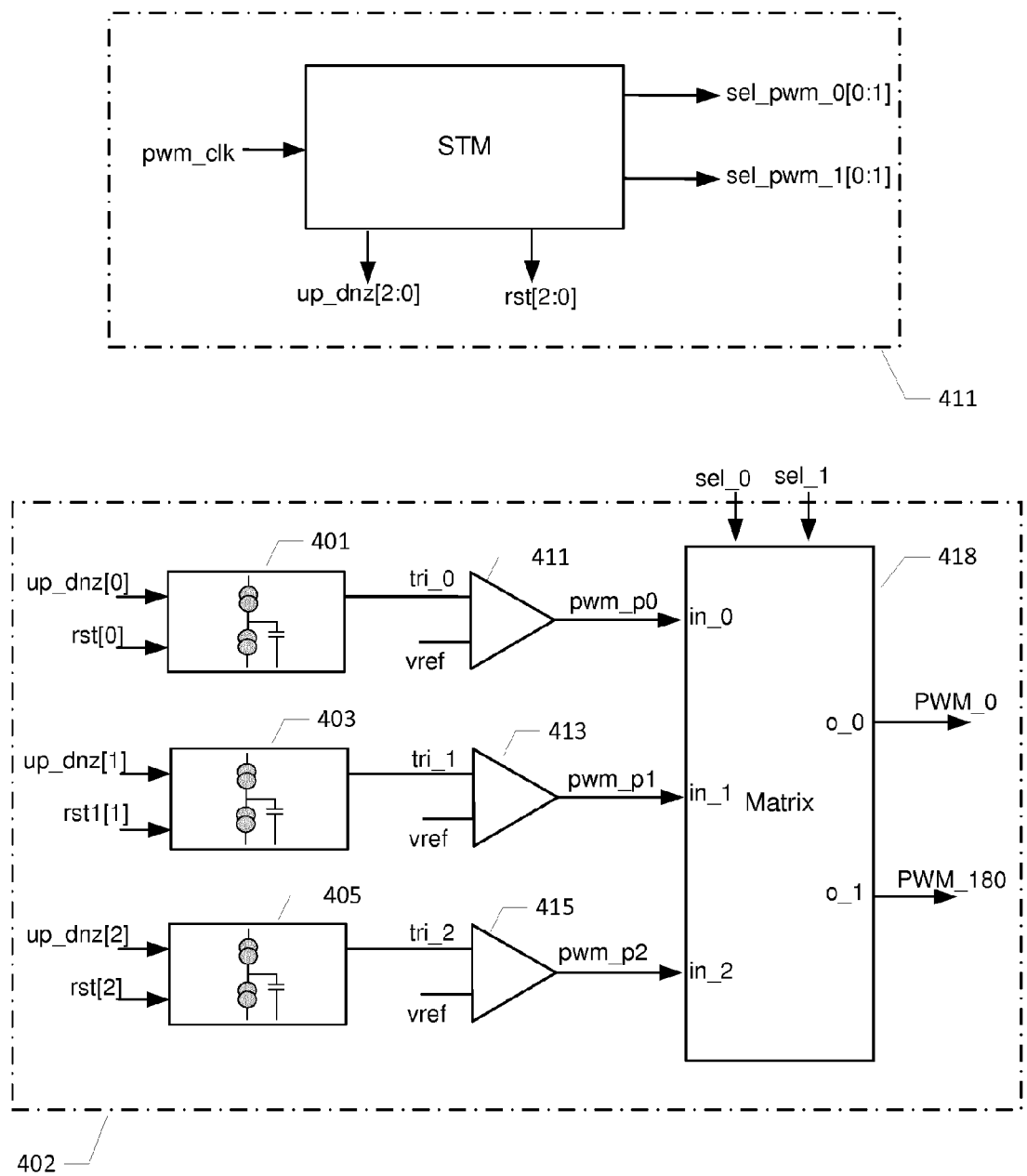
FIG. 4 is a schematic diagram of a 2-phase version of the multiphase pulse width modulator in accordance with a second preferred embodiment thereof.

FIG. 4 is a simplified schematic diagram of a second embodiment of the multiphase pulse width modulator. Corresponding features of the first embodiment of the multiphase pulse width modulator 102, 111 and the present embodiment are indicated by corresponding reference numerals to ease comparison. The present multiphase pulse width modulator 402, 411 is configured for producing 2 mutually phase shifted pulse width modulated signals, PWM_0 and PWM_180, derived from 3 pulse width modulated phase signals supplied at the input terminals of a crosspoint or matrix switch 418, i.e. pwm_p0, pwm_p1 and pwm_p2. Hence, in the present embodiment, N equals 2. The timing of operations of the multiphase pulse width modulator 402 is controlled by a crosspoint switch controller 411 based on a state machine via a number of digital control signals up_dnz[2:0], rst[2:0], sel_pwm_0[0:1] and sel_pwm_1[0:1] similarly to the first embodiment of the modulator.

The multiphase pulse width modulator 402 produces the two previously discussed mutually phase shifted pulse width modulated signals PWM_0 and PWM_180 that are in opposite phase, i.e. having a phase difference of 180 degrees. Each of these mutually phase shifted pulse width modulated signals has a predetermined cycle time or PWM period set by the carrier frequency of the PWM clock signal discussed above. The multiphase pulse width modulator 402 comprises 3 analog triangular waveform generators 401, 403, and 405 operating as the previously discussed analog triangular waveform generators of the first embodiment. The multiphase pulse width modulator 402 further comprises 3 separate comparators 411, 413 and 415 similar to those discussed in connection with the first embodiment of the invention and coupled to respective outputs of the 3 analog triangular waveform generators 401, 403, and 405. Hence, the 3 pulse width modulated phase signals pwm_p0, pwm_p1 and pwm_p2 are generated at the respective comparator outputs of the 3 comparators and applied to respective inputs terminals, in_0, in_1 and in_2, of the crosspoint switch 418. The crosspoint switch 418 is configured to via an internal switching network electrically coupling two of the three input terminals in_0-in_2 to the two output terminals o_0, o_1 at every point in time in accordance with the input-to-output routing selection defined by the digital select signals or bits sel_0 and sel_1. A particular routing selection of the crosspoint switch 418 last for the duration of one half-cycle time, i.e. the duration of the idle signal segment of each of the mutually phase shifted triangular waveforms tri0, tri1 and tri2 as discussed below after which a new routing selection is made by the state machine as described previously. At each of the output terminals o_0 and o_1, each of the mutually phase shifted pulse width modulated signals PWM_0 and PWM_180 is generated by stitching or splicing time segments of the pulse width modulated phase signals pwm_p0, pwm_p1 and pwm_p2 in accordance with a predetermined time sequence. Hence, as mentioned previously the mutually phase shifted pulse width modulated signals PWM_0 and PWM_180 are generated simultaneously by interleaving the three pulse width modulated phase signals pwm_p0, pwm_p1 and pwm_p2 at each of the output terminals o_0, o_1, but at each time point using different segments of the pulse width modulated phase signals. The resulting waveforms of the 3 triangular waveforms tri0, tri1 and tri2, the 3 pulse width modulated phase signals pwm_p0, pwm_p1 and pwm_p2 and the two 180 degrees phase shifted pulse width modulated signals PWM_0 and PWM_180 are schematically depicted on FIG. 5. As illustrated on FIG. 5, the length or duration, Δph, of the idle signal segment 507 of the first triangular waveform tri_0, and of the residual triangular waveforms tri1 and tri2, corresponds in this embodiment to the 180 degrees phase shift between the pulse width modulated signals PWM_0 and PWM_180 utilised in the present embodiment. Hence, in this embodiment the duration of the idle signal segment 507 also equals the phase shift between two adjacent phases of PWM_0 and PWM_180 signals. Hence, the mutually phase shifted 3 analog triangular waveforms trio, tri1 and tri2 possess a relative phase shift of one-half cycle time, or 180 degrees, of the mutually phase shifted pulse width modulated signals PWM_0 and PWM_180. The duration of a rising segment 503 and a falling segment 505 of the first triangular waveform tri_0, and tri1 and tri2 as well, correspond to the cycle time the pulse width modulated signals PWM_0 and PWM_180. The period time of each of the time of each of the triangular waveforms tri_0, tri1 and tri2 corresponding to three times the phase shifts Δph and this applies to the cycle time of each of the pulse width modulated phase signals pwm_p0, pwm_p1 and pwm_p2 as well. On the other hand, each of the pulse width modulated signals PWM_0 and PWM_180 has a cycle time or period corresponding to two times the phase shifts Δph. The dotted arrow 511 illustrates how the crosspoint switch switches from connecting the pulse width modulated phase signal pwm_p0 to connecting the pulse width modulated phase signal pwm_p2 to the first output of the cross point switch at the start of the idling segment of tri0 and the end point of the idling segment of tri2. Hence, generating the first two cycles of pulse width modulated signal PWM_0 in the process.

Figure 6:
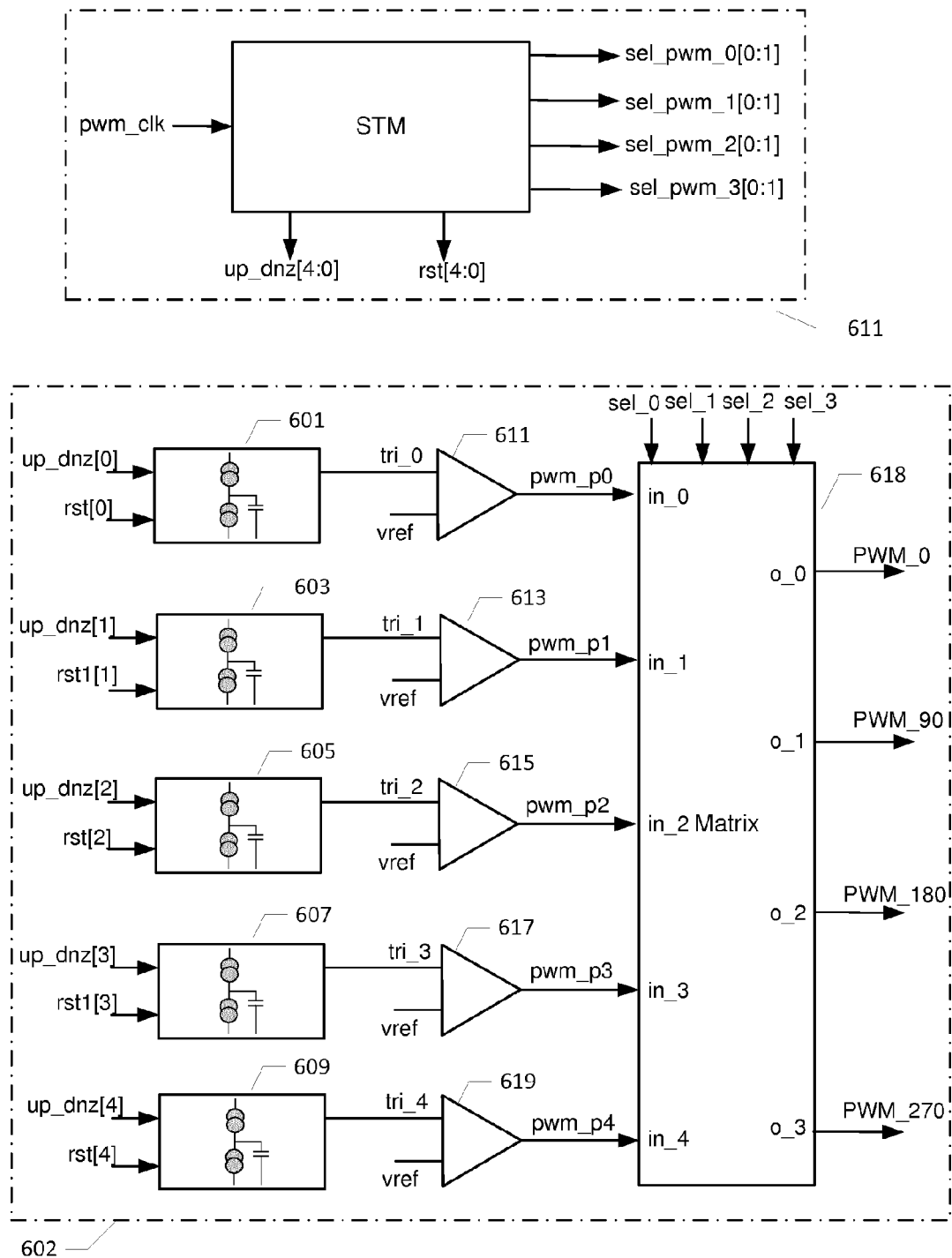
FIG. 6 is a schematic diagram of a 4-phase version of the multiphase pulse width modulator in accordance with a third preferred embodiment thereof.
Figure 7:
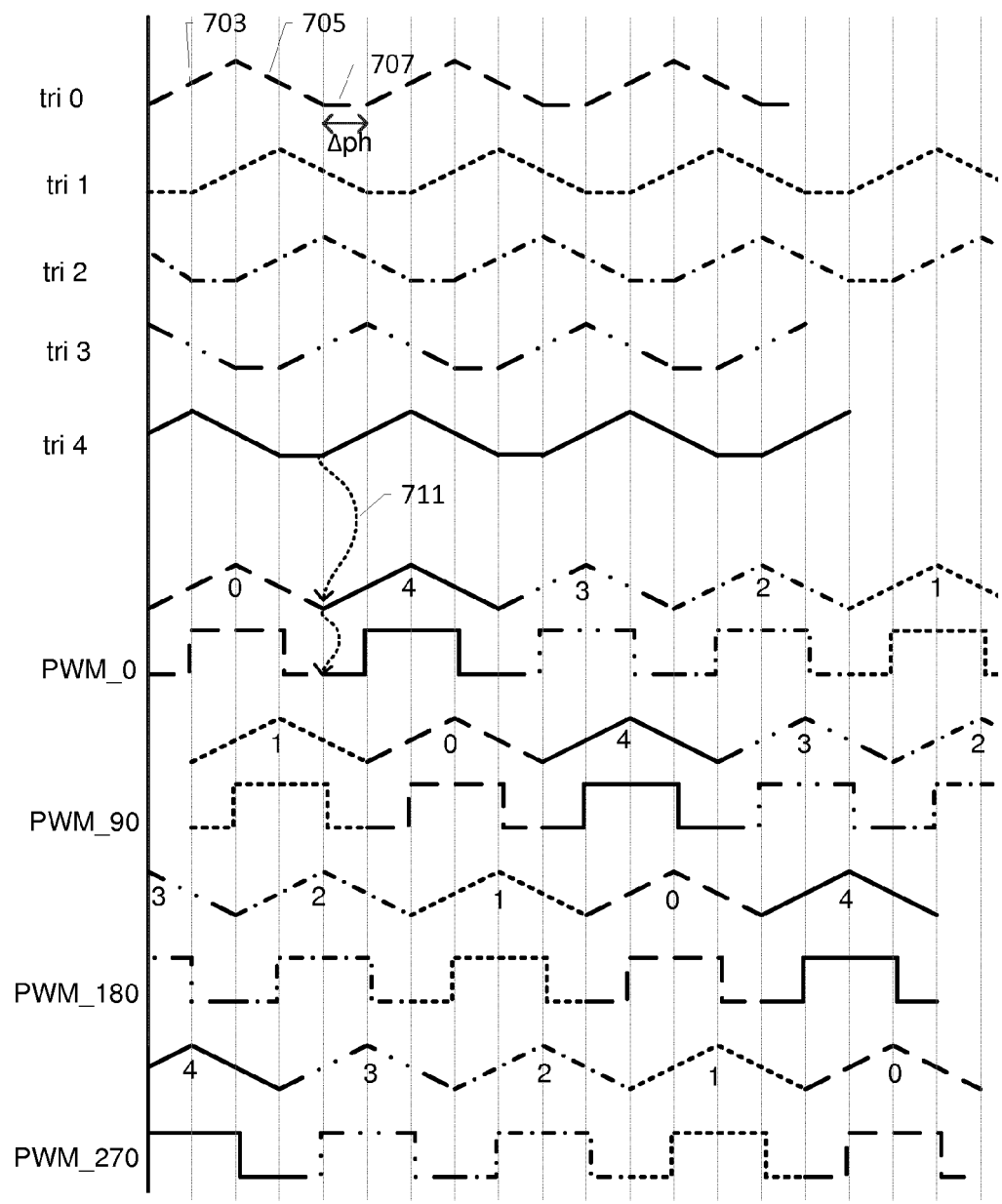
FIG. 7 is a plot of 5 exemplary multiphase analog triangular waveforms and 4 corresponding pulse width modulated signals generated by the 4-phase version of multiphase pulse width modulator depicted on FIG. 6.

FIG. 6 is a simplified schematic diagram of a third embodiment of the multiphase pulse width modulator. Corresponding features of the first embodiment of the multiphase pulse width modulator 102, 111 and the present embodiment are indicated by corresponding reference numerals to ease comparison. The present multiphase pulse width modulator 602, 611 is configured for producing the four mutually phase shifted pulse width modulated signals PWM_0, PWM_90, PWM_180 and PWM_270, derived from five pulse width modulated phase signals at the input terminals of a crosspoint or matrix switch 618, i.e. pwm_p0, pwm_p1, pwm_p2, pwm_p3 and pwm_p4. Hence, in the present embodiment, N equals 4. The timing of operations of the multiphase pulse width modulator 602 is controlled by a crosspoint switch controller 611 based on a state machine via a number of digital control signals up_dnz[4:0], rst[4:0], sel_pwm_0[0:1], sel_pwm_1[0:1] , sel_pwm_2[0:1] and sel_pwm_3[0:1] similarly to the first embodiment of the modulator.

The multiphase pulse width modulator 602 produces the four previously discussed 90 degrees mutually phase shifted pulse width modulated signals PWM_0, PWM_90, PWM_180 and PWM_270. The multiphase pulse width modulator 602 comprises five analog triangular waveform generators 601, 603, 605, 607 and 609 operating as the previously discussed analog triangular waveform generators of the first embodiment. The multiphase pulse width modulator 602 further comprises five separate comparators 611, 613, 615, 617 and 619 operating similarly to those discussed in connection with the first and second embodiments to generate the above-mentioned five pulse width modulated phase signals inputted to the crosspoint or matrix switch 618. As above the operation of the crosspoint or matrix switch 618 has the result that each of the mutually phase shifted pulse width modulated signals PWM_0, PWM_90, PWM_180 and PWM_270 is generated by stitching or splicing together interleaved time segments of the pulse width modulated phase signals in accordance with a predetermined time sequence. This predetermined sequence of the time segments of the pulse width modulated phase signals is depicted on the analog triangular waveforms above each of the signals PWM_0, PWM_90, PWM_180 and PWM_270. In this embodiment, the time sequence is 0-4-3-2-1-0-4-3 etc. The time sequence is the same for all of the signals PWM_0, PWM_90, PWM_180 and PWM_270, but 430 degrees phase or time-shifted between each pair of adjacent signals of the mutually phase shifted pulse width modulated signals.

Figure 5:
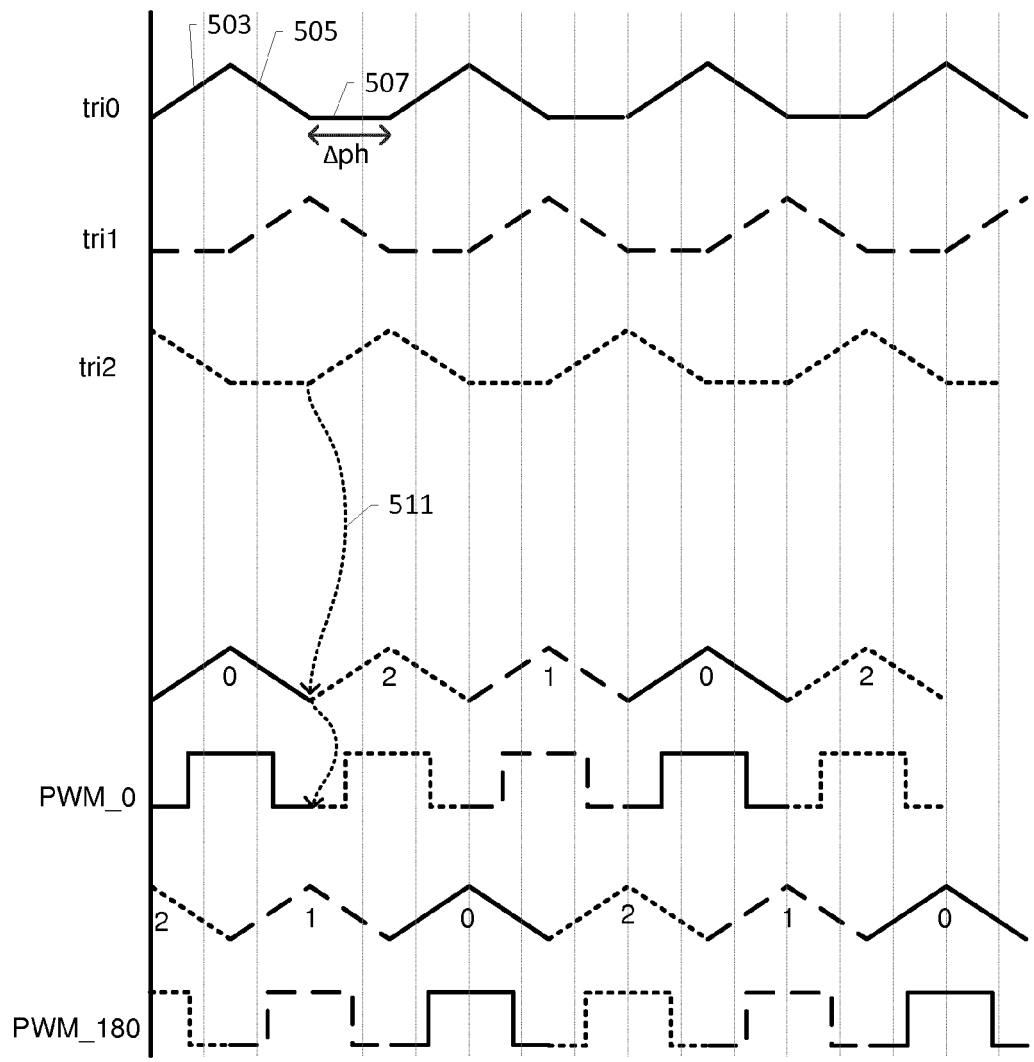
FIG. 5 is a plot of 3 exemplary multiphase analog triangular waveforms and 2 corresponding pulse width modulated signals generated by the 2-phase version of multiphase pulse width modulator on FIG. 4.

The resulting waveforms of the 3 triangular waveforms tri0, tri1 and tri2, the 3 pulse width modulated phase signals pwm_p0, pwm_p1 and pwm_p2, and the two 180 degrees phase shifted pulse width modulated signals PWM_0 and PWM_180 are schematically depicted on FIG. 5. As illustrated, the length or duration of the idle signal segment 507 of the first triangular waveform tri_0, and the idle segment duration of the residual triangular waveforms tri1 and tri2, corresponds in this embodiment to the 180 degrees phase shift between the pulse width modulated signals PWM_0 and PWM_180 utilised in the present embodiment. Hence, in this embodiment the duration of the idle signal segment 507 also equals the phase shift between two adjacent phases of PWM_0 and PWM_180 signals. Hence, each of the 3 analog triangular waveforms tri0, tri1 and tri2 has a cycle or period corresponding to four times the phase shifts Δph and this applies to the cycle time of each of the pulse width modulated phase signals pwm_p0, pwm_ and pwm_p2 as well. On the other hand, each of the pulse width modulated signals PWM_0 and PWM_180 has a cycle time or period corresponding to three times the phase shifts Δph.

The invention claimed is:
1. A multiphase pulse width modulator producing N mutually phase shifted pulse width modulated signals having a predetermined cycle time for class D audio amplifiers, comprising:
  N+1 analog triangular waveform generators configured to produce respective N+1 mutually phase shifted analog triangular waveforms each comprising a rising segment with substantially linearly increasing signal amplitude, a falling segment with substantially linearly decreasing signal amplitude and an idle signal segment with substantially constant signal amplitude such that a duration of the rising segment and falling segments corresponds to the predetermined cycle time and a duration of the idle segment corresponds to a phase shift between two adjacent phases of the N mutually phase shifted pulse width modulated signals,
  N+1 comparators each comprising a first input operatively coupled to respective ones of the N+1 mutually phase shifted analog triangular waveforms and a second input coupled to an audio signal to generate at least N+1 mutually phase shifted pulse width modulated phase signals;
  a crosspoint or matrix switch comprising N+1 input terminals, coupled to respective ones of the N+1 mutually phase shifted pulse width modulated phase signals, and N output terminals configured for supplying respective ones of the N mutually phase shifted pulse width modulated signals,
  a crosspoint switch controller configured to:
  selectively connect each of the N+1 input terminals to each output terminal of the N output terminals for a duration of the predetermined cycle time in a predetermined time sequence to simultaneously generate the N mutually phase shifted pulse width modulated signals such that each of the signals comprises interleaved time segments of the N+1 mutually phase shifted pulse width modulated phase signals;
  N being a positive integer larger than or equal to 2.
2. A multiphase pulse width modulator according to claim 1, wherein the crosspoint switch controller is configured to:
  at each point in time connecting a subset of N inputs of the N+1 inputs to respective ones of the N output terminals and disconnecting the residual input of the crosspoint switch from anyone of the N output terminals,
  switching between consecutive subsets of the N input at time intervals corresponding to the predetermined phase shift between two adjacent phases of the N mutually phase shifted pulse width modulated signals.
3. A multiphase pulse width modulator according to claim 2, wherein the crosspoint switch controller is configured to:
  selecting, at each point in time, the residual input of the crosspoint switch as the pulse width modulated phase signal derived from an idle signal segment of the analog triangular waveform.
4. A multiphase pulse width modulator according to claim 2, wherein each of N +1 analog triangular waveform generators comprises:
  a set of active and passive electrical components defining characteristics of the rising and falling segments of the analog triangular waveform,
  timing signal inputs for controlling on-sets and durations of the rising and falling segments of the analog triangular waveform and the on-set and duration of the idle segment,
  an analog DC reference voltage,
  a reset switch configured to selectively connect and the disconnect the analog triangular waveform to the analog DC reference voltage for the duration of the idle segment to generate the idle segment of the analog triangular waveform.
5. A multiphase pulse width modulator according to claim 2, comprising a multiphase pulse width modulator according to any of the preceding claims, wherein the crosspoint switch comprises a switching network comprising a plurality of semiconductor switches configured for connecting the N+1 input terminals to respective ones of the N output terminals in accordance with the control signals of the crosspoint switch controller.
6. A multiphase pulse width modulator according to claim 2,
  wherein the crosspoint switch comprises N multiplexers each having N+1 multiplexer inputs and a multiplexer output;
  the N+1 multiplexer inputs being coupled to respective ones of the N+1 input terminals of the crosspoint switch and each multiplexer output being coupled one of the N output terminals of the crosspoint switch.
7. A class D audio amplifier comprising a multiphase pulse width modulator according to claim 2,
  wherein the N mutually phase shifted pulse width modulated signals are coupled to respective output power transistors of a multi-level output stage of the class D audio amplifier; and
  the second input of each of the N+1 comparators being coupled to the audio signal output of a loop filter of a feedback loop of the class D audio amplifier.
8. A multiphase pulse width modulator according to claim 1, wherein the N+1 analog triangular waveform generators are configured to produce a phase shift between the N+1 mutually phase shifted analog triangular waveforms corresponding to the duration of the idle segment.
9. A multiphase pulse width modulator according to claim 8, wherein each of N +1 analog triangular waveform generators comprises:
  a set of active and passive electrical components defining characteristics of the rising and falling segments of the analog triangular waveform,
  timing signal inputs for controlling on-sets and durations of the rising and falling segments of the analog triangular waveform and the on-set and duration of the idle segment,
  an analog DC reference voltage, a reset switch configured to selectively connect and the disconnect the analog triangular waveform to the analog DC reference voltage for the duration of the idle segment to generate the idle segment of the analog triangular waveform.

10. A multiphase pulse width modulator according to claim 8, comprising a multiphase pulse width modulator according to any of the preceding claims, wherein the crosspoint switch comprises a switching network comprising a plurality of semiconductor switches configured for connecting the N+1 input terminals to respective ones of the N output terminals in accordance with the control signals of the crosspoint switch controller.

11. A multiphase pulse width modulator according to claim 8,
wherein the crosspoint switch comprises N multiplexers each having N+1 multiplexer inputs and a multiplexer output;
the N+1 multiplexer inputs being coupled to respective ones of the N+1 input terminals of the crosspoint switch and each multiplexer output being coupled one of the N output terminals of the crosspoint switch.

12. A class D audio amplifier comprising a multiphase pulse width modulator according to claim 8,
wherein the N mutually phase shifted pulse width modulated signals are coupled to respective output power transistors of a multi-level output stage of the class D audio amplifier; and
the second input of each of the N+1 comparators being coupled to the audio signal output of a loop filter of a feedback loop of the class D audio amplifier.

13. A multiphase pulse width modulator according to claim 1, wherein each of N +1 analog triangular waveform generators comprises:
a set of active and passive electrical components defining characteristics of the rising and falling segments of the analog triangular waveform,
timing signal inputs for controlling on-sets and durations of the rising and falling segments of the analog triangular waveform and the on-set and duration of the idle segment,
an analog DC reference voltage,
a reset switch configured to selectively connect and the disconnect the analog triangular waveform to the analog DC reference voltage for the duration of the idle segment to generate the idle segment of the analog triangular waveform.

14. A multiphase pulse width modulator according to claim 13, the set of active and passive electric components comprises:
a first current source and a second current source configured to selectively charge and discharge a capacitor in accordance with the timing signal to determine the rising and falling segments of the analog triangular waveform.

15. A multiphase pulse width modulator according to claim 1, comprising a multiphase pulse width modulator according to any of the preceding claims, wherein the crosspoint switch comprises a switching network comprising a plurality of semiconductor switches configured for connecting the N+1 input terminals to respective ones of the N output terminals in accordance with the control signals of the crosspoint switch controller.

16. A multiphase pulse width modulator according to claim 1, wherein the predetermined cycle time of each of the N mutually phase shifted pulse width modulated signals lies between 6.67 μs and 0.2 μs.

17. A multiphase pulse width modulator according to claim 1,
wherein the crosspoint switch comprises N multiplexers each having N+1 multiplexer inputs and a multiplexer output;
the N+1 multiplexer inputs being coupled to respective ones of the N+1 input terminals of the crosspoint switch and each multiplexer output being coupled one of the N output terminals of the crosspoint switch.

18. A class D audio amplifier comprising a multiphase pulse width modulator according to claim 1,
wherein the N mutually phase shifted pulse width modulated signals are coupled to respective output power transistors of a multi-level output stage of the class D audio amplifier; and
the second input of each of the N+1 comparators being coupled to the audio signal output of a loop filter of a feedback loop of the class D audio amplifier.

19. A sound reproducing assembly, comprising:
a class D audio amplifier according to claim 18; and
a loudspeaker load operatively coupled to an output of the output stage.

20. A method of generating N mutually phase shifted pulse width modulated signals, each having a predetermined cycle time, for class D audio amplifiers, the method comprising steps of:
automatically generating N+1 mutually phase shifted analog triangular waveforms each comprising a rising segment with substantially linearly increasing signal amplitude, a falling segment with substantially linearly decreasing signal amplitude and an idle signal segment with substantially constant signal amplitude such that a duration of the rising and falling segments corresponds to the predetermined cycle time and a duration of the idle segment corresponds to a phase shift between two adjacent phases of the N mutually phase shifted pulse width modulated signals,
automatically comparing each of the N+1 mutually phase shifted analog triangular waveforms to an audio signal to generate N+1 mutually phase shifted pulse width modulated phase signals;
automatically applying the N+1 mutually phase shifted pulse width modulated phase signals to a respective ones of N+1 input terminals of a crosspoint or matrix switch,
selectively connecting, in a predetermined repetitive sequence, each of the N+1 input terminals to each output terminal of N output terminals of the crosspoint or matrix switch for a duration of the predetermined cycle time to simultaneously generate the N mutually phase shifted pulse width modulated signals such that each signal comprises interleaved time segments of the N+1 pulse width modulated phase signals;
N being a positive integer larger than or equal to 2.

* * * * *